United States Patent
Brandon et al.

(10) Patent No.: US 10,707,062 B2
(45) Date of Patent: Jul. 7, 2020

(54) MICROWAVE GENERATORS AND MANUFACTURE OF SYNTHETIC DIAMOND MATERIAL

(71) Applicant: ELEMENT SIX TECHNOLOGIES LIMITED, Didcot, Oxfordshire (GB)

(72) Inventors: John Robert Brandon, Didcot (GB); Neil Perkins, Didcot (GB)

(73) Assignee: Element Six Technologies Limited, Didcot (GB)

( * ) Notice: Subject to any disclaimer, the term of this patent is extended or adjusted under 35 U.S.C. 154(b) by 0 days.

(21) Appl. No.: 15/745,751

(22) PCT Filed: Aug. 22, 2016

(86) PCT No.: PCT/EP2016/069785
§ 371 (c)(1),
(2) Date: Jan. 18, 2018

(87) PCT Pub. No.: WO2017/032733
PCT Pub. Date: Mar. 2, 2017

(65) Prior Publication Data
US 2018/0218881 A1    Aug. 2, 2018

(30) Foreign Application Priority Data
Aug. 24, 2015 (GB) .................................. 1514998.2

(51) Int. Cl.
*H01J 37/32* (2006.01)
*C23C 16/27* (2006.01)
(Continued)

(52) U.S. Cl.
CPC ........ *H01J 37/3299* (2013.01); *C23C 16/274* (2013.01); *C23C 16/511* (2013.01);
(Continued)

(58) Field of Classification Search
USPC ............... 118/723 MW; 156/345.41; 315/39, 315/111.01, 111.21, 500; 331/5, 86–91
See application file for complete search history.

(56) References Cited

U.S. PATENT DOCUMENTS 4,865,710 A * 9/1989 Aaron ..................... C23C 14/35
204/298.2
4,940,015 A * 7/1990 Kobashi ................. C23C 16/26
118/723 AN
(Continued)

FOREIGN PATENT DOCUMENTS

EP    1377138 A1    1/2004
GB    2486779 A     6/2012
(Continued)

OTHER PUBLICATIONS

Balmer, R. S., et al., "Chemical vapour deposition synthetic diamond: materials, technology and applications," Journal of Physics: Condensed Matter, Jun. 29, 2009, pp. 1-23, vol. 21, No. 36, IOP Publishing Ltd.
(Continued)

*Primary Examiner* — Rakesh K Dhingra
(74) *Attorney, Agent, or Firm* — Dean W. Russell; Clark F. Weight; Kilpatrick Townsend & Stockton LLP

(57) ABSTRACT

A microwave generator system for use in a microwave plasma enhanced chemical vapour deposition (MPECVD) system, the microwave generator system comprising: a microwave generator unit configured to produce microwaves at an operating power output suitable for fabricating synthetic diamond material via a chemical vapour deposition process; a fault detection system configured to detect a fault in the microwave generator unit which results in a reduction in the operating power output or a change in frequency; and a re-start system configured to restart the microwave generator unit in response to a fault being detected and recover (Continued)

the operating power output or frequency in a time period of less than 10 seconds after the fault in the microwave generator unit which caused the reduction in the operating power output or the change in frequency.

18 Claims, 5 Drawing Sheets

(51) Int. Cl.
    *C23C 16/511*     (2006.01)
    *H01J 37/244*     (2006.01)
    *H05H 1/46*     (2006.01)

(52) U.S. Cl.
    CPC ...... *H01J 37/244* (2013.01); *H01J 37/32192* (2013.01); *H01J 37/32201* (2013.01); *H01J 37/32266* (2013.01); *H01J 37/32935* (2013.01); *H01J 37/32944* (2013.01); *H01J 2237/24592* (2013.01); *H01J 2237/3321* (2013.01); *H05H 2001/4607* (2013.01); *H05H 2001/4622* (2013.01)

(56) References Cited

U.S. PATENT DOCUMENTS

| | | | | |
|---|---|---|---|---|
| 5,036,253 A | * | 7/1991 | Nilssen | H02M 7/53832 |
| | | | | 315/151 |
| 5,438,242 A | * | 8/1995 | Simpson | H05B 41/24 |
| | | | | 315/219 |
| 5,584,972 A | * | 12/1996 | Lantsman | H01J 37/34 |
| | | | | 204/192.12 |
| 5,642,268 A | * | 6/1997 | Pratt | H05B 6/666 |
| | | | | 315/106 |
| 5,838,114 A | * | 11/1998 | Penzenstadler | H05B 41/24 |
| | | | | 315/277 |
| 6,144,894 A | | 11/2000 | Nguyen | |
| 6,544,599 B1 | * | 4/2003 | Brown | C23C 4/12 |
| | | | | 427/383.1 |
| 2008/0053988 A1 | * | 3/2008 | Arai | H01J 37/32192 |
| | | | | 219/680 |
| 2008/0309239 A1 | * | 12/2008 | Kasai | H01J 37/32192 |
| | | | | 315/39.51 |
| 2009/0195160 A1 | * | 8/2009 | Shinogi | H01J 65/044 |
| | | | | 315/39 |
| 2010/0187998 A1 | | 7/2010 | Yuzurihara et al. | |

FOREIGN PATENT DOCUMENTS

| | | |
|---|---|---|
| GB | 2508993 A | 6/2014 |
| WO | 2012084655 A2 | 6/2012 |
| WO | 2012084656 A1 | 6/2012 |
| WO | 2012084657 A1 | 6/2012 |
| WO | 2012084658 A1 | 6/2012 |
| WO | 2012084659 A2 | 6/2012 |
| WO | 2012084661 A1 | 6/2012 |

OTHER PUBLICATIONS

United Kingdom Patent Application No. GB1514998.2, Combined Search and Examination Report dated Mar. 9, 2016, 6 pages.
United Kingdom Patent Application No. GB1614258.0, Search Report dated Dec. 22, 2016, 4 pages.
International Patent Application No. PCT/EP2016/069785, International Search Report and Written Opinion dated Nov. 9, 2016, 12 pages.

* cited by examiner

MICROWAVE GENERATORS AND MANUFACTURE OF SYNTHETIC DIAMOND MATERIAL

FIELD OF INVENTION

The present invention relates to microwave generators for use in microwave plasma enhanced chemical vapour deposition (MPECVD) systems with particular focus on embodiments which are adapted for robust and reliable fabrication of CVD synthetic diamond materials.

BACKGROUND OF INVENTION

Chemical vapour deposition processes for synthesis of diamond materials are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave field. Source gases including a carbon source and molecular hydrogen are fed into the plasma reactor vessel and can be activated by the standing microwave field to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for synthetic diamond film growth using a CVD process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

The present applicant has previously filed a number of patent applications directed to microwave plasma activated CVD reactor hardware and CVD diamond synthesis methodology for achieving high quality, thick CVD diamond growth of both single crystal and polycrystalline CVD diamond materials over relatively large areas and relatively high growth rates. These patent applications include patent applications describing:

(i) certain aspects of the structure and geometry of the microwave plasma chamber (e.g. WO2012/084661 which describes the use of a compact $TM_{011}$ resonance mode plasma chamber configuration and WO2012/084657 which describes the provision of a plasma stabilizing annulus projecting from a side wall of the plasma chamber);

(ii) certain aspects of the microwave power coupling configuration (e.g. WO2012/084658 which describes a microwave power delivery system for supplying microwave power to a plurality of microwave plasma reactors and WO2012/084659 which describes a microwave coupling configuration comprising an annular dielectric window, a coaxial waveguide, and a waveguide plate comprising a plurality of apertures disposed in an annular configuration for coupling microwaves towards the plasma chamber);

(iii) certain aspects of the substrate preparation, geometry, and temperature control configurations within the microwave plasma chamber (e.g. WO2012/084655 which describes how to prepare, locate, and control substrate parameters within a microwave plasma reactor to achieve desirable electric field and temperature profiles); and (iv) certain aspects of the gas flow configuration and gas flow parameters within a microwave plasma chamber (e.g. WO 2012/084661 which describes a microwave plasma reactor with a multi-nozzle gas inlet array having a desirable geometric configuration for achieving uniform diamond growth over large areas and WO2012/084656 which describes the use of high gas flow rates and injection of process gases with a desirable Reynolds number to achieving uniform doping of synthetic diamond material over large areas).

By providing a microwave plasma reactor incorporating the features as described in the above identified patent applications the present applicant has achieved high quality, thick CVD diamond growth of both single crystal and polycrystalline CVD diamond materials over relatively large areas and relatively high growth rates.

That said, there is still an on-going need to further improve upon prior art arrangements in order to provide a robust, efficient, and high yield synthesis platform for synthetic diamond products. In this regard, it is an aim of embodiments of the present invention to provide a system which has improved robustness, efficiency, and yield.

SUMMARY OF INVENTION

Microwave plasma activated CVD diamond synthesis is somewhat unusual when compared with most other chemical vapour deposition processes. For example, a microwave plasma activated CVD diamond synthesis process has the following combination of features:
 (i) a requirement for very high power microwaves;
 (ii) a requirement for very long synthesis times while maintaining stable, high power microwaves to fabricate high quality, thick layers of CVD diamond material; and
 (iii) the CVD diamond synthesis process is very sensitive to instabilities and/or interruptions in the synthesis process.

One problem with such a high microwave power, long synthesis time process is that the microwave source can periodically develop a fault which causes an interruption in the synthesis process. Such faults are exacerbated by running the microwave generator at very high power operation. While this is not problematic for many types of process which can be restarted to continue the synthesis process, it has been found that interruptions of the microwave source for even relatively short time periods, of the order of 10 seconds for example, can cause irreversible loss of a diamond synthesis process for a number of reasons including:
 delamination of diamond from a support substrate on which the diamond is disposed as a result of rapid cooling and a thermal expansion coefficient mismatch between the diamond material and the underlying support substrate;
 uncontrolled cooling, giving difficulty in restarting at operating pressures and potentially leading to cracking of material; and
 large pressure swings leading to instability after restarting the synthesis process.

For certain diamond synthesis processes, such microwave generator faults leading to an irreversible loss of the diamond synthesis process can be quite common, in some instances occurring several times in a single growth run, and can result in a significant decrease in yield.

The present inventors have found that after a microwave generator fault interrupts a microwave plasma activated CVD diamond synthesis process, if the synthesis process can be re-started in a very short time period, typically less than ten seconds and more preferably of the order of a second, then problems such as diamond delamination, diamond cracking, and problems associated with restarting at required operating pressures can be avoided.

Such a rapid re-start of a diamond synthesis process is not trivial. In fact, configuring a microwave generator system to re-start in such a rapid manner is contrary to conventional microwave generator start-up systems which are specifically configured to implement a slow start-up protocol. Conventional microwave generator systems are configured to avoid a rapid start-up as this can damage the microwave generator and can reduce the overall lifetime of the microwave generator, primarily due to deterioration and ultimate failure of the microwave generator filament.

Accordingly, a microwave generator system must be specifically re-configured to enable a rapid re-start. The desirability of this functionality seems to be largely a result of the unusual characteristics of a CVD diamond synthesis process in terms of power, synthesis time, and sensitivity to variations and interruptions in the synthesis process.

The present inventors have found that a microwave generator which is suitably re-configured to be rapidly re-started when a fault occurs can enable a high power diamond synthesis process to continue without an irretrievable loss of the process. Further still, while a reduction in microwave generator lifetime is not desirable, it has been found that any cost implications resulting from a potential reduction in microwave generator lifetime caused by implementing a rapid re-start methodology are more than off-set by the increase in yield of high value synthetic diamond products achieved using a rapid re-start methodology. Furthermore, by careful configuration and control of the rapid re-start methodology it is possible to minimize damage to the microwave generator such that the lifetime of the microwave generator is not unduly shortened when re-configured to utilize a rapid re-start protocol.

In light of the above, according to a first aspect of the present invention there is provided a microwave generator system for use in a microwave plasma enhanced chemical vapour deposition (MPECVD) system, the microwave generator system comprising:
 a microwave generator unit configured to produce microwaves at an operating power output suitable for fabricating synthetic diamond material via a chemical vapour deposition process;
 a fault detection system configured to detect a fault in the microwave generator unit which results in a reduction in the operating power output or a change in frequency; and
 a re-start system configured to restart the microwave generator unit in response to a fault being detected and recover the operating power output or frequency in a time period of less than 10 seconds after the fault in the microwave generator unit which caused the reduction in the operating power output or the change in frequency.

According to a second aspect of the present invention there is provided a microwave plasma enhanced chemical vapour deposition system for fabricating synthetic diamond material via a chemical vapour deposition process, the microwave plasma enhanced chemical vapour deposition system comprising:
 a microwave generator system according to the first aspect of the invention;
 a plasma chamber defining a resonant cavity;
 a coupling configuration for feeding microwaves from the microwave generator system into the plasma chamber;
 a gas flow system for feeding process gases into the plasma chamber and removing them therefrom; and a substrate mount disposed in the plasma chamber for supporting a substrate on which synthetic diamond material is to be grown.

According to a third aspect of the present invention there is provided a method of manufacturing synthetic diamond material using a chemical vapour deposition process, the method comprising:

providing a microwave plasma enhanced chemical vapour deposition system according to the second aspect of the invention;

locating a substrate over the substrate mount;

feeding microwaves into the plasma chamber;

feeding process gases into the plasma chamber; and forming synthetic diamond material on the substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

The synthesis of diamond by microwave plasma enhanced chemical vapour deposition (MPECVD) has matured over the past two decades, and is now routinely capable of synthesising diamond at growth rates of approximately 1-100 μm hr$^{-1}$. At a low growth rate of 1 μm hr$^{-1}$, a 1 mm thick part would take 1000 hours to synthesise. Even at higher growth rates, synthesis times for CVD diamond materials, particularly high quality, thick layers of CVD diamond material, are very long. Consequently, the equipment involved must be both highly reliable and capable of prolonged running without fault.

As described in the summary of invention section, extended interruption of the microwave source, for example of the order of 10 seconds or greater, can cause irreversible loss of the process for a number of reasons:

delamination of diamond from a support substrate on which the diamond is disposed as a result of rapid cooling and a thermal expansion coefficient mismatch between the diamond material and the underlying support substrate;

uncontrolled cooling, giving difficulty in restarting at operating pressures and potentially leading to cracking of material; and large pressure swings leading to instability after restarting the synthesis process.

Figure 1:
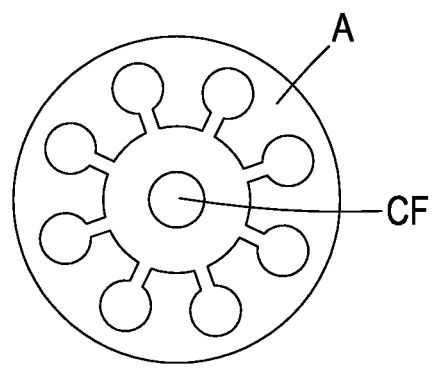
FIG. 1 shows a schematic diagram of a portion of a microwave generator.

High-frequency, high-power microwave devices are typically based on a vacuum tube design, with magnetrons being the most-commonly used in the field. A schematic diagram of a portion of a magnetron is shown in FIG. 1. The magnetron comprises a central cathode filament CF and an electronically isolated anode block A, and the entire device is mounted into a magnetic field provided by a static or electro magnet.

During standard operation, the filament is heated to stimulate thermionic emission, and a suitably high voltage is applied between the filament and anode creating a current between the filament and anode. As the path of the electrons is bent by the external magnetic field from the magnet, they induce oscillations in each of the anode cavities, with the magnetron output frequency defined by the dimensions of the cavities. The electric field in this mode of operation Or mode) is shown FIG. 2(a). Magnetrons, like klystrons etc., use electron bunching to achieve RF output insensitive to electron transit time. However, even before current flows (the Hull threshold) from the cathode to anode there will be a distribution of the electrons in proximity to the filament. The voltage required to achieve current flow depends on the correct bunching of the electrons.

Figure 2:
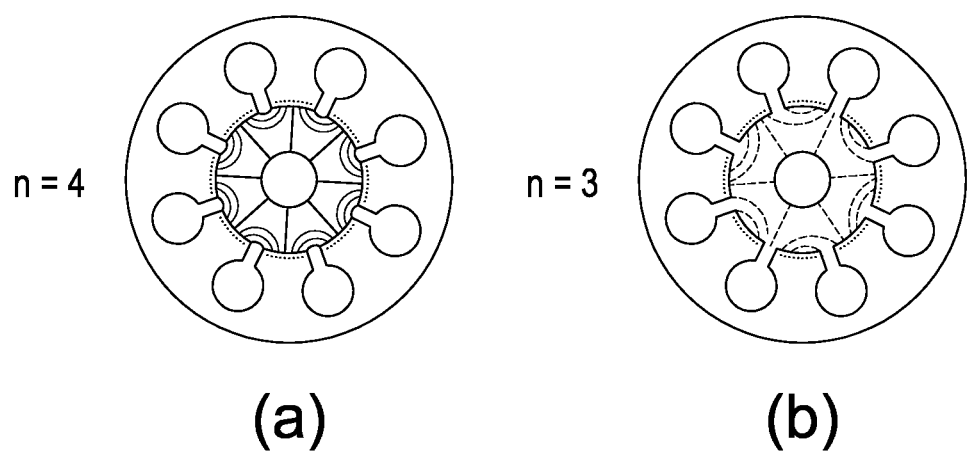
FIG. 2(a) shows a schematic diagram illustrating a desired mode of microwave generator operation.
FIG. 2(b) shows a schematic diagram illustrating an undesirable mode of microwave generator operation.

A magnetron can suffer from a number of different faults during operation, including but not limited to:

moding (oscillation in an undesired mode—see FIG. 2(b));

arcing between cathode and anode (causing a large anode current spike) associated with residual gas in the magnetron;

arcs internal to the filament (between coils of the inductive heater); and magnetron end of life, e.g. filament failure after ~10,000 hrs due to thermal creep/fatigue.

Any of these faults will result in the loss of microwave output power and hence will cause disruption to the diamond synthesis process. It is possible to reduce the frequency of these faults by careful selection and setup of the magnetron/magnet system. For example, faults can be reduced by using best practice vacuum conditioning and sealing, optimum waveguide matching (for stability and not necessarily efficiency), and using optimized magnet current and filament temperature—although one might argue that arc resistance and π-1 mode resistance are to some extent mutually incompatible. However, despite taking all such precautions, it is practically impossible to completely eliminate faults in dynamic high-power vacuum devices.

Since faults can't be completely eliminated, a microwave system designed for maximum robustness for a diamond synthesis process benefits from being able to recover from these faults within a timeframe that does not irretrievably disrupt the diamond synthesis process—less than 10 seconds and ideally less than 1 second. Addressing this issue is important to increase efficiency, reliability and run to completion metrics.

Figure 3:
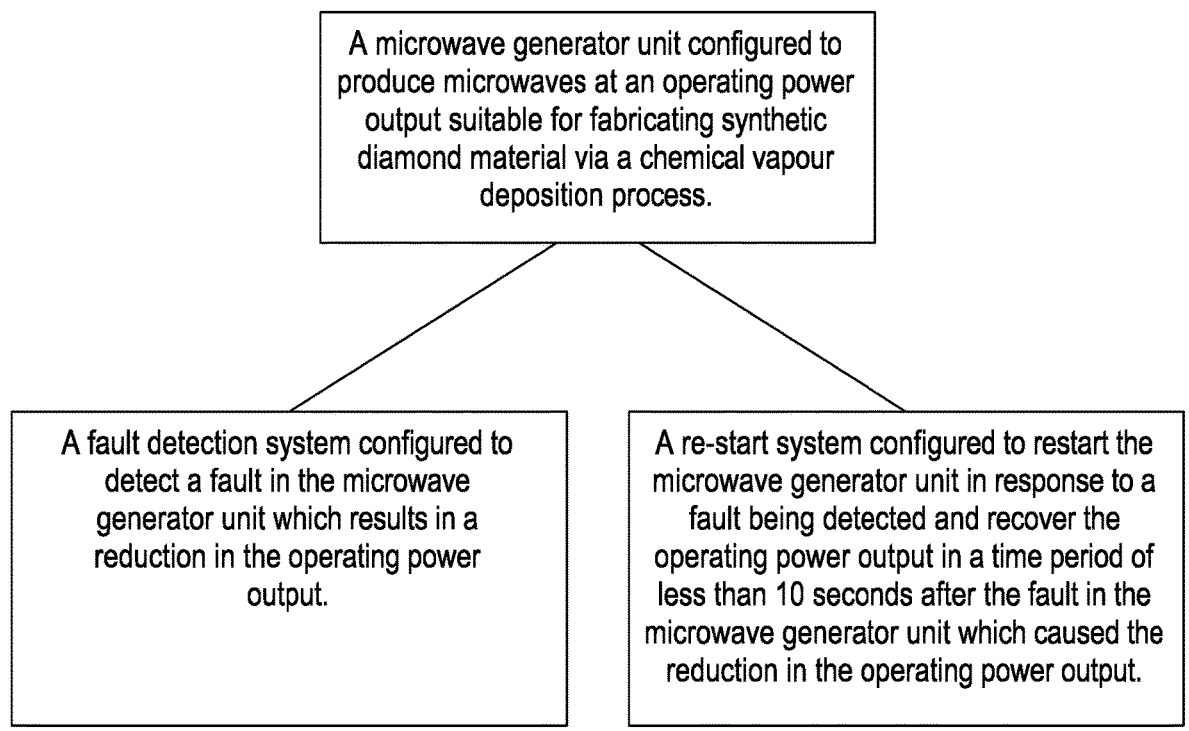
FIG. 3 shows a schematic illustration of the basic components of a microwave generator system according to an embodiment of the present invention.

FIG. 3 shows a schematic illustration of the basic components of a microwave generator system according to an embodiment of the present invention. The microwave generator system comprises:

a microwave generator unit configured to produce microwaves at an operating power output suitable for fabricating synthetic diamond material via a chemical vapour deposition process;

a fault detection system configured to detect a fault in the microwave generator unit which results in a reduction in the operating power output or a change in frequency; and a re-start system configured to restart the microwave generator unit in response to a fault being detected and recover the operating power output or frequency in a time period of less than 10 seconds, 8 seconds, 6 seconds, 4 seconds, 2 seconds, or 1 second after the fault in the microwave generator unit which caused the reduction in the operating power output or the change in frequency.

The microwave generator unit may be configured to produce an operating power output of at least 1 kW, 2 kW, 3 kW, or 4 kW and/or less than 100 kW, 80 kW, 60 kW, or 40 kW and/or any combination of these upper and lower values. The precise power range depends in part on the operating frequency: for operating frequencies at 2.45 GHz +/−0.1 GHz the power is preferably in a range of at least 1 kW, 2 kW, or 3 kW and less than 20 kW, 15 kW, 10 kW, or 8 kW, whilst for operating frequencies at 896 MHz +/−30 MHz the power is preferably in a range of at least 10 kW, 15 kW, 20 kW, or 25 kW and less than 100 kW, 80 kW, 70 kW, or 60 kW. Such a microwave generator unit typically comprises a magnetron. Furthermore, the microwave generator unit may comprise a direct current switched-mode power supply unit or a linear power supply unit.

Two classes of microwave generator fault have been found to be important in the context of a diamond synthesis process:

general tube arcing faults, of varied origin; and $\pi$-1 oscillation mode faults which may occur spontaneously (rare) or during start-up or re-start of the generator (common).

As such, the fault detection system according to embodiments of the present invention may be configured to detect at least one, and preferably both of these types of fault.

A tube arcing fault can be detected by an anode current spike. While prior art microwave generators have an anode overcurrent protection method of some sort—in other words a way of detecting an arc—these are generally not resettable, at least in a short time frame. Some prior art microwave generators use high voltage fuses and some have manually resettable overcurrent relays connecting the high voltage supply to ground. An anode current spike is not easy to see with an SMPSU (switched-mode power supply unit) microwave generator due to its very rapid shutdown time which is of the order of microseconds. A fairly high sampling rate is needed to see this and a typical 1 kHz sample rate will tend to miss a transient anode current spike. To avoid this problem, the fault detection system may be re-configured to provide a sample rate of greater than 1 kHz in order to ensure that an anode current spike is detected.

A $\pi$-1 oscillation mode fault can be detected by at least one of:

an antenna tuned to a frequency of the $\pi$-1 oscillation mode;

an antenna tuned to a frequency of a fundamental $\pi$ mode;

detecting a rise in a cathode voltage above a cathode voltage threshold value;

detecting a reduction in an anode voltage below an anode voltage threshold value; and detecting a rise in a ratio of cathode voltage to anode current below a threshold value.

For example, a $\pi$-1 oscillation mode fault may be detected by detecting a rise in the ratio of cathode voltage to anode current as a result of the cathode voltage increasing above a cathode voltage threshold value and the anode voltage dropping below an anode voltage threshold value.

The re-start system can be configured to respond to a tube arcing fault by implementing the following steps in sequence:

increasing a filament current in the microwave generator unit above a standard operating filament current value to heat up the filament of the microwave generator unit;

ramping anode-cathode high tension towards a standard operating level; and then reducing the filament current down to the standard operating filament current value thereby returning to standard operating conditions within the time period as previously defined.

Furthermore, the re-start system can be configured to respond to a $\pi$-1 oscillation mode fault by implementing the following steps in sequence:

maintaining an operating condition in which a cathode voltage is above a threshold value and/or an anode current in below a threshold value for a pre-set time; and then implementing the sequence of steps as defined previously for a tube arcing fault.

Tube arcing faults and mode faults and how they are dealt with to provide a rapid re-start of the microwave generator and of an associated diamond synthesis process are discussed in more detail below.

General Tube Arcing Faults

After a general tube arcing fault, and the high tension voltage between the anode and cathode has fallen to zero, the magnetron filament must be pre-heated by an applied filament current before high tension between the anode and cathode is re-applied. Failure to pre-heat the filament with an appropriate 'standby' current will result in either an undesirable oscillation mode or a complete failure to oscillate. The temperature is of order 2,000 Kelvin and it is important to control the temperature of the filament to within a few 10 s of degrees. Heating of the filament must be performed in a rapid manner to achieve a fast re-start in accordance with the present invention. This contrasts with manufacturers' recommended filament pre-heat times which are of order of 150 to 200 seconds and standard microwave generators are generally configured such that the filament re-heat step will not be achieved in times substantially shorter than this.

Once the high tension voltage is re-applied and the device is operating, the applied filament current must be reduced to maintain a constant temperature. This is because additional heating is provided by self-bombardment of emitted electrons. If the tube faults during operation, the self-bombardment ceases at a point when the applied filament current is below the optimal standby current. A combination of high radiative heat losses from the filament and a slow recovery to the standby current, which is typical of a 50 Hz, thyristor (SCR) controlled supply circuit, results in a filament that may be below optimum operation temperature. If the filament temperature is too low (~20-40 degrees lower than nominal) then there is a high probability that the tube will begin to (π-1) mode upon restart. Higher temperatures can substantially reduce efficiency and lifetime of the magnetron (primarily by failure of the filament) and may make the magnetron more prone to arcing.

Figure 4:
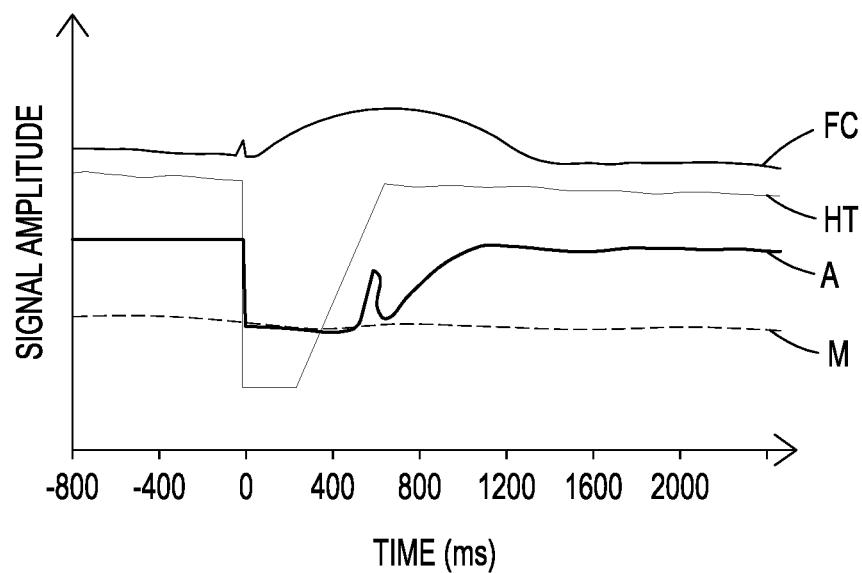
FIG. 4 shows parameter traces for a microwave generator which has been successfully returned to operating conditions within 1.2 seconds of a tube arcing fault in the microwave generator.

During testing it has been found that the filament temperature is critical to achieving a fast re-start after a tube fault. Power supply time constants have been optimized for a fast return to standby filament current, ramp up of high tension, and finally a ramp down of applied filament current. Such a procedure is shown in FIG. 4 which shows parameter traces for a microwave generator which has been successfully returned to operating conditions within 1.2 seconds of a tube arcing fault in the microwave generator. Top to bottom the traces are: filament current (FC); anode-cathode high tension (HT); anode current (A); electromagnet current (M). After the fault at 0 seconds, the filament current increases to standby levels, with high tension ramping approximately 0.3 seconds after the fault. The filament current is subsequently reduced and standard operating conditions are reached.

π-1 Oscillation Mode Faults

As previously indicated, FIG. 2(a) shows a schematic diagram illustrated a desired π-mode of microwave generator operation whereas FIG. 2(b) shows a schematic diagram illustrated an undesirable π-1 mode of microwave generator operation.

A π-1 mode fault is externally characterised by a drop in anode current, an immediate increase in cathode voltage, and subsequent slow reduction of voltage which is qualitatively similar to an open circuit. π-1 mode faults can be detected in several ways:
  using an antenna tuned to the frequency of the π-1 mode;
  using an antenna tuned to the frequency of the fundamental (π) mode; and/or
  monitoring a ratio of cathode voltage to anode current.

The first two methods using an antenna tuned to either the it or π-1 mode can be difficult due to the potential similarity of the frequencies of the it and π-1 modes. The frequency separation of these modes is dependent on the internal dimensions and construction of the magnetron and will vary by manufacturer. As a result, it has been found that the third method of monitoring a ratio of cathode voltage to anode current can be the most robust way to detect π-1 faults.

During testing, it has been found that there is a significant benefit to allowing the π-1 mode to continue for a short period of time (typically 0.1-0.5 seconds) before restarting. The π-1 mode increases the electron self-bombardment of the filament and hence has the effect of heating the filament very rapidly which can be advantageous for achieving a fast re-start. A re-start procedure as described in the previous section for a tube arcing fault can then be implemented.

The sequence of events following a π-1 fault is then as follows:
  cathode voltage is above a threshold (e.g. >−15 kV);
  anode current is below a threshold (e.g. <1.5 A);
  condition is maintained for a pre-set time (e.g. >0.1-0.5 s);
  the high tension voltage is turned off (either deliberately or triggered automatically by hitting the over-voltage limit); and
  a general tube fault restart is initiated by re-applying the high tension voltage.

The adjustment of thresholds and timing is important for effective operation—ripples in the cathode voltage or brief drops in anode current should not trigger a restart.

Figure 5:
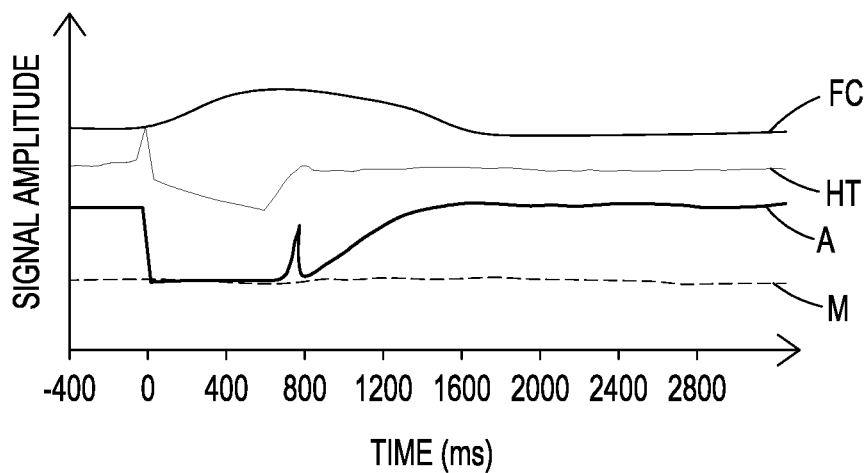
FIG. 5 shows parameter traces for a microwave generator which has been successfully returned to operating conditions within 1.6 seconds of a mode fault in the microwave generator.

FIG. 5 shows parameter traces for a microwave generator which has been successfully returned to operating conditions within 1.6 seconds of a π-1 mode fault in the microwave generator utilizing the aforementioned methodology. Top to bottom the traces are: filament current (FC); anode-cathode high tension (HT); anode current (A); electromagnet current (M).

Figure 6:
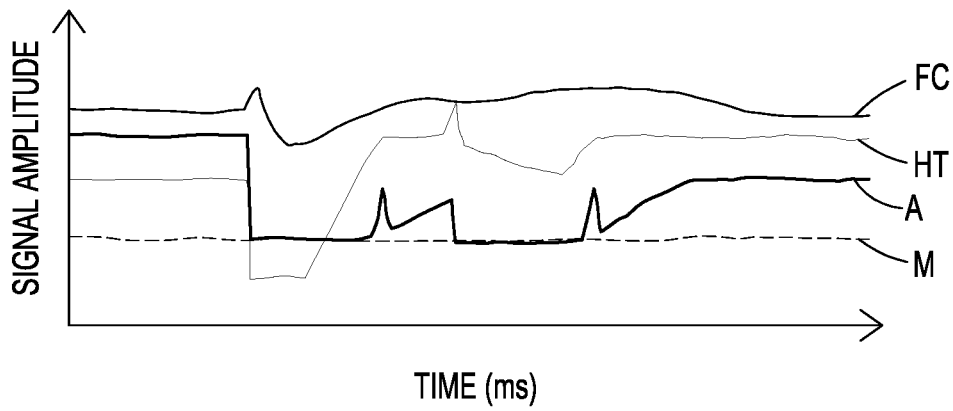
FIG. 6 shows parameter traces for a microwave generator which has been successfully returned to operating conditions after experiencing both a tube arcing fault and a mode fault in sequence.

While methods of dealing with general tube arcing faults and π-1 oscillation mode faults are described above, one preferred approach is to combine these methodologies to ensure that the microwave system is robust to both classes of failure. The combination of the two above approaches leads to a robust and reliable solution for the common faults encountered during magnetron operation during a CVD diamond synthesis process. The methodology is capable of recovering from multiple sequential faults. For example, FIG. 6 shows parameter traces for a microwave generator which has been successfully returned to operating conditions after experiencing both a tube arcing fault and a mode fault in sequence. Top to bottom the traces are: filament current (FC); anode-cathode high tension (HT); anode current (A); electromagnet current (M). In the traces a general tube arcing fault is followed by a fast re-start. However, immediately following the re-start the magnetron begins to oscillate in the π-1 mode. This mode fault is detected and a second fast re-start is initiated by removal of the high tension voltage, after which standard operating conditions are resumed by re-applying the high tension voltage.

In an extreme case, an anode fault can be supressed to the order of a few microseconds if steps are taken to include a ballast resistor in conjunction with fast switching devices.

The microwave generator system as described above provides a robust power source for a microwave plasma enhanced chemical vapour deposition system which is suitable for fabricating synthetic diamond material via a chemical vapour deposition process. Such a microwave plasma enhanced chemical vapour deposition system comprises:
  a microwave generator system as described above;
  a plasma chamber defining a resonant cavity;
  a coupling configuration for feeding microwaves from the microwave generator system into the plasma chamber;
  a gas flow system for feeding process gases into the plasma chamber and removing them therefrom; and
  a substrate mount disposed in the plasma chamber for supporting a substrate on which synthetic diamond material is to be grown.

Figure 7:
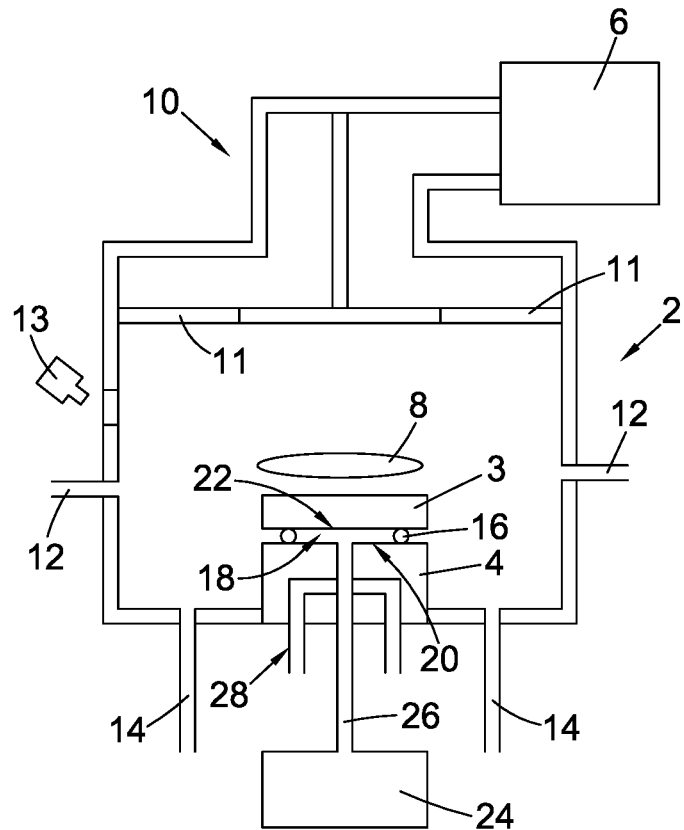
FIG. 7 shows a cross-sectional view of a microwave plasma reactor system configured to deposit synthetic diamond material using a chemical vapour deposition technique in accordance with an embodiment of the present invention.

FIG. 7 shows an example of a microwave plasma reactor system. The microwave plasma reactor system comprises the following basic components: a plasma chamber 2; a substrate holder 4 disposed in the plasma chamber for supporting a substrate 5; a microwave generator 6, for forming a plasma 8 within the plasma chamber 2; a microwave coupling configuration 10 for feeding microwaves from the microwave generator 6 into the plasma chamber 2 via dielectric windows 11; and a gas flow system comprising one or more gas inlets 12 and one or more gas outlets 14 for feeding process gases into the plasma chamber 2 and removing them therefrom.

The substrate 5 is spaced apart from the substrate holder 4 by spacer wires or spacer pads 16 to define a gas gap 18 between a supporting surface 20 of the substrate holder 4 and a supporting surface 22 of the substrate 5. Furthermore a gas supply system 24 is coupled to the gas gap 18 via a supply pipe 26 which extends from the gas supply system 24 through the substrate holder 4 and is configured to supply gas into the gas gap 18 through one or more outlets in the supporting surface of the substrate holder. A coolant liquid supply system 28 is also provided for cooling the substrate holder 4. While the configuration as illustrated in FIG. 7 shows a configuration in which a single plasma chamber is coupled to the microwave generator, one preferred configuration is to couple multiple plasma chambers to a single microwave generator. This allows the power generating capability of a microwave generator to be fully utilized. However, as the microwave generator is driven at or near its maximum power capability, this increases the possibility of generator faults. As such, the presently described fast re-start capability is particularly useful in such configurations.

Figure 8:
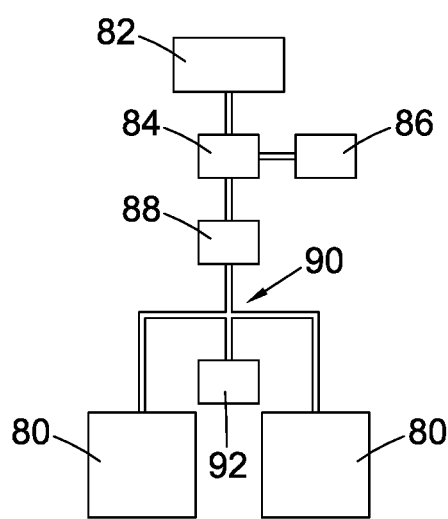
FIG. 8 shows a schematic diagram of a microwave plasma reactor system comprising two plasma chambers.

FIG. 8 illustrates a microwave plasma reactor system which comprises two microwave plasma reactors 80 coupled to a single microwave generator 82 via an isolator 84 coupled to a sink 86, a tuner 88, and a waveguide junction 90 configured whereby the outputs to the microwave plasma reactors 80 are effectively de-coupled from each other such that microwave power reflected back from one reactor is prevented from passing through the waveguide junction 90 into the output for the other reactor. The waveguide junction 90 must have a very precise geometric configuration so as to evenly split microwave power input from the tuner 88 while decoupling the outputs to each of the plasma reactors thereby preventing any reflected power from feeding across directly into another plasma reactor causing an imbalance due to cross-talk. Simultaneously, the junction geometry should be such that reflected power which is balanced should be fed back to the tuner 88 such that it can be re-used. Finally, the junction geometry should be configured such that only the excess reflected power which is not balanced is dumped into a sink 92, such as a water load. Such a configuration is described in more detail in WO2012/084658.

Figure 9:
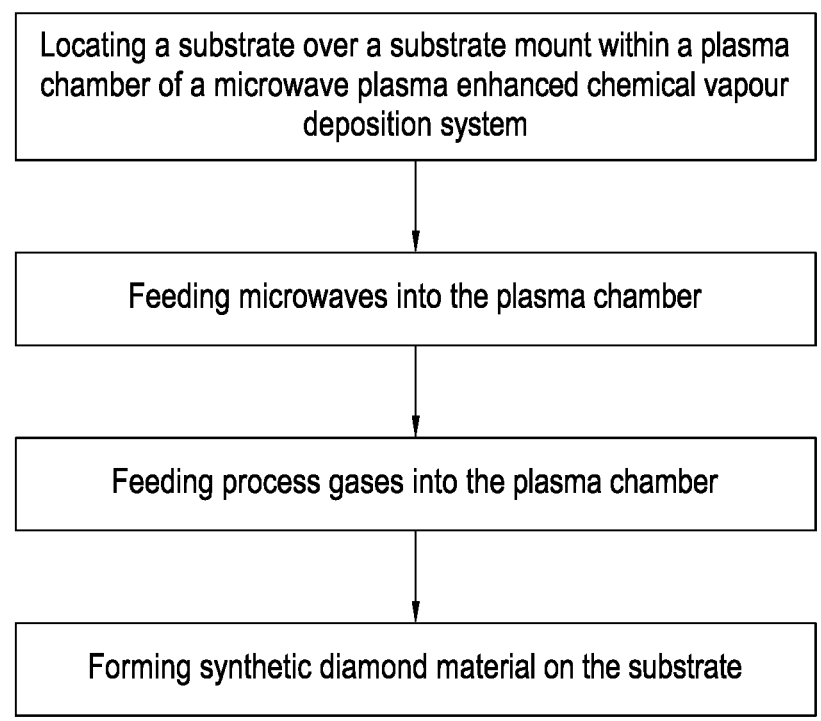
FIG. 9 shows a flow diagram illustrating the steps involved in deposit synthetic diamond material using a chemical vapour deposition technique in accordance with an embodiment of the present invention.

FIG. 9 shows a flow diagram illustrating the steps involved in deposit synthetic diamond material using a microwave plasma reactor system as described above. The method comprises:

locating a substrate over the substrate mount;
feeding microwaves into the plasma chamber;
feeding process gases into the plasma chamber; and
forming synthetic diamond material on the substrate.

In relation to the plasma synthesis process, it may be noted that the dynamic response of a magnetron to the load impedance can be problematic. If one considers the response of the magnetron to a load, two things can be seen: power pulling; and frequency pulling. A Rieke diagram expresses the behaviour of a magnetron to different loads in this context. Even with high quality isolators (circulators) the magnitude of the reflection coefficient (of order 0.1) is still sufficient to induce significant 'load pulling'. In combination with a long section of waveguide, a magnetron can experience 'long line' effects in which the phase of the reflected power varies significantly with a relatively small change in source frequency. This, coupled with a high Q applicator, can lead to very unstable source/load combinations. A plasma load has a very fast response when compared to more conventional loads for an industrial microwave heating source. With the "wrong" absolute phase of reflective power, the combination of frequency and power pulling, coupled with high stored energy, can lead to a very high incidence of anode faults in the microwave generator. The use of double isolators, i.e. two circulators in tandem, is necessary to reduce incidence of anode faults in certain microwave generators. However, when using certain microwave generators one circulator can be sufficient. Reasons are not abundantly clear, but may be related to the closed loop control on the magnet current circuit. Direct current switched-mode power supply units (DC SMPSUs) overcome many of these problems by managing to achieve low ripple output without reliance on filtering (stored energy). While a linear power supply unit might have several hundred joules of stored energy (mostly in an inductor) a DC SMPSU can limit that energy to perhaps 10 Joules. Also by operating as a current limited source there are no issues in working with a potentially unstable magnet current control loop.

With a linear supply the stored energy represents a further problem as dissipation in the magnetron in the form of an arc can cause substantial damage to the filament with the creation of 'craters'. Over time these craters will tend to act as high spots, initiating further arc events and eventually leading to premature demise of the magnetron. Attempts to mitigate this using 'crow-bar' circuits that divert and dump the stored energy into a load are only partially effective, although it has been demonstrated that re-starts can be achieved in under one second in this way. As such, while embodiments of the present invention can be implemented using either linear power supply units or direct current switched-mode power supply units, it is considered that direct current switched-mode power supply units are preferred.

In light of the above discussion, it is evident that optimum stored energy for the power supply unit is an important aspect. In a linear supply the amount of energy stored in the supply's inductors, capacitors, etc. can be very large (of order 100 Joules). When a tube faults by arcing, the stored energy is discharged very quickly across the arc and will vaporise high spots on the filament, as well as cause outgassing due to the extreme heat generated—both of these can reduce the probability of a successful restart because e.g. the adsorbed gas will increase the chances of arcing. and is well above optimum as the damage to the filament is severe and the release of adsorbed gas along with the damage will make a subsequent restart less likely. A switched-mode power supply unit has a lower stored energy (of the order of 10 Joules) and is closer to optimum as a small amount of energy can initially help to get rid of high spots etc. on the filament. For example, the microwave generator unit may comprise a power supply unit which stores less than 100, 80, 60, 40, or 20 Joules of energy and/or more than 2, 4, 6, or 8 Joules of energy and/or any combination of these upper and lower limits.

A ballast resistor can also be advantageous. By choosing the resistor value to typically drop, say, 10% of the voltage from the power supply unit in the event of a short circuit (an arc) most of the energy is deposited in the resistor. A 'crowbar' circuit (e.g. Ignitron) can also be used to divert energy. An ignitron is a mercury-based vacuum tube device capable of switching large currents/voltages quickly. The ignitron can be configured in parallel with the magnetron and if an arc occurs the ignitron is switched on and most of the energy is dumped through that to ground, rather than through the filament. A triode/tetrode etc. can also be used as a high voltage switch in a linear generator. These operate even faster than an SMPSU and in combination with a ballast resistor have shown arc recovery times in the order of a few microseconds. As such, the microwave generator unit may comprise such a circuit which diverts stored energy when a fault is detected. That said, in a switched power supply the amount of energy stored at any point is much lower than for a linear supply and so no switches are needed to redirect energy. In fact, a small amount of energy has been found to be beneficial as it aids in reducing small high spots without doing more permanent damage to the filament.

While this invention has been particularly shown and described with reference to embodiments, it will be understood to those skilled in the art that various changes in form and detail may be made without departing from the scope of the invention as defined by the appending claims. For example, while the present invention has been described in the context of CVD diamond synthesis, it is envisaged that the microwave generator system could also be used in other CVD processes which require high power microwaves, long process times, and which are sensitive to instabilities and/or interruptions in the CVD process.

The invention claimed is:

1. A microwave generator system for use in a microwave plasma enhanced chemical vapor deposition (MPECVD) system, the microwave generator system comprising:
a microwave generator configured to produce microwaves at an operating power output suitable for fabricating synthetic diamond material via a chemical vapor deposition process;
wherein the microwave generator system is further configured to detect a fault in the microwave generator which results in a reduction in the operating power output or a change in frequency, and to detect at least one of a tube arcing fault and a $\pi$-1 oscillation mode fault; and
wherein the microwave generator system is further configured to restart the microwave generator in response to a fault being detected and recover the operating power output or frequency in a time period of less than 10 seconds after the fault in the microwave generator which caused the reduction in the operating power output or the change in frequency.

2. A microwave generator system according to claim 1, wherein the microwave generator is configured to produce an operating power output of at least 1 kW, 2 kW, 3 kW or 4 kW and less than 100 kW, 80 kW, 60 kW, or 40 kW.

3. A microwave generator system according to claim 1, wherein the microwave generator comprises a magnetron.

4. A microwave generator system according to claim 1, wherein the microwave generator comprises a direct current switched-mode power supply.

5. A microwave generator system according to claim 1, wherein the microwave generator comprises a power supply unit which stores less than 100, 80, 60, 40, or 20 Joules of energy.

6. A microwave generator system according to claim 5, wherein the power supply stores more than 2, 4, 6, or 8 Joules of energy.

7. A microwave generator system according to claim 1, wherein the microwave generator comprises a linear power supply.

8. A microwave generator system according to claim 1, wherein the microwave generator comprises a circuit which diverts stored energy when a fault is detected.

9. A microwave generator system according to claim 1, wherein the microwave generator system is configured to detect both the tube arcing fault and the $\pi$-1 oscillation mode fault.

10. A microwave generator system according to claim 1, wherein the tube arcing fault is detected by an anode current spike.

11. A microwave generator system according to claim 1, wherein the $\pi$-1 oscillation mode fault is detected by at least one of:
an antenna tuned to a frequency of the $\pi$-1 oscillation mode;
an antenna tuned to a frequency of a fundamental $\pi$ mode;
detecting a rise in a cathode voltage above a cathode voltage threshold value;
detecting a reduction in an anode voltage below an anode voltage threshold value; and
detecting a rise in a ratio of cathode voltage to anode current below a threshold value.

12. A microwave generator system according to claim 11, wherein the $\pi$-1 oscillation mode fault is detected by detecting the rise in the ratio of cathode voltage to anode current as a result of the cathode voltage increasing above the cathode voltage threshold value and the anode voltage dropping below the anode voltage threshold value.

13. A microwave generator system according to claim 1, wherein the time period for the re-start system to restart the microwave generator in response to the fault being detected and recover the operating power output is less than 8 seconds, 6 seconds, 4 seconds, 2 seconds, or 1 second.

14. A microwave generator system according to claim 1, wherein the microwave generator system is configured to respond to a tube arcing fault by implementing the following steps in sequence:
increasing a filament current in the microwave generator unit above a standard operating filament current value to heat up the filament of the microwave generator ramping anode-cathode voltage towards a standard operating level; and
then
reducing the filament current down to the standard operating filament current value thereby returning to standard operating conditions within the time period as previously defined.

15. A microwave generator system according to claim 1, wherein the microwave generator system is configured to respond to a $\pi$-1 oscillation mode fault by implementing the following steps in sequence:
maintaining an operating condition in which a cathode voltage is above a threshold value and/or an anode current in below a threshold value for a pre-set time; and
then
implementing the sequence of steps as defined in claim 14.

16. A microwave plasma enhanced chemical vapour deposition system for fabricating synthetic diamond material via a chemical vapour deposition process, the microwave plasma enhanced chemical vapour deposition system comprising:
a microwave generator system according to claim 1;
a plasma chamber defining a resonant cavity;
a coupling configuration for feeding microwaves from the microwave generator system into the plasma chamber;
a gas flow system for feeding process gases into the plasma chamber and removing them therefrom; and
a substrate mount disposed in the plasma chamber for supporting a substrate on which synthetic diamond material is to be grown.

17. A microwave plasma enhanced chemical vapour deposition system according to claim 16, wherein the microwave generator system is coupled to at least two plasma chambers.

18. A method of manufacturing synthetic diamond material using a chemical vapour deposition process, the method comprising:
- providing a microwave plasma enhanced chemical vapour deposition system according to claim 16;
- locating a substrate over the substrate mount;
- feeding microwaves into the plasma chamber;
- feeding process gases into the plasma chamber; and
- forming synthetic diamond material on the substrate.

* * * * *